United States Patent
Eckert et al.

(10) Patent No.: US 9,496,188 B2
(45) Date of Patent: Nov. 15, 2016

(54) SOLDERING THREE DIMENSIONAL INTEGRATED CIRCUITS

(71) Applicant: International Business Machines Corporation, Armonk, NY (US)

(72) Inventors: Martin Eckert, Moetzingen (DE); Eckhard Kunigkeit, Stuttgart (DE); Otto A. Torreiter, Leinfelden-Echterdingen (DE); Quintino L. Trianni, Boblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/672,654

(22) Filed: Mar. 30, 2015

(65) Prior Publication Data
US 2016/0293497 A1 Oct. 6, 2016

(51) Int. Cl.
*H01L 21/00* (2006.01)
*H01L 21/66* (2006.01)

(52) U.S. Cl.
CPC ............ *H01L 22/12* (2013.01); *H01L 22/34* (2013.01)

(58) Field of Classification Search
CPC .............................. H01L 22/12; H01L 22/34
See application file for complete search history.

(56) References Cited

U.S. PATENT DOCUMENTS

| | | | |
|---|---|---|---|
| 6,179,196 B1* | 1/2001 | Heim | B23K 1/012 228/13 |
| 6,369,345 B1* | 4/2002 | Zaloga | B23K 1/0056 219/85.13 |
| 2009/0294974 A1 | 12/2009 | Leung et al. | |
| 2011/0237026 A1 | 9/2011 | Farooq et al. | |
| 2014/0065771 A1 | 3/2014 | Gruber et al. | |
| 2014/0256090 A1 | 9/2014 | Interrante et al. | |
| 2014/0346664 A1 | 11/2014 | Eppes | |

OTHER PUBLICATIONS

Burns, James, "TSV-Based 3D Integration", Chapter 2, pp. 13-32, © Springer Science+Business Media, LLC 2011.
Skordas, Spyridon, "Wafer-Scale 3D Integration (3Di)—Gen III", Think Friday University, Nov. 16, 2012, © 2009 IBM Corporation.
Zhang et al., "Optimizing Au and in Micro-Bumping for 3D Chip Stacking", 2008 Electronic Components and Technology Conference, © 2008 IEEE, <http://ieeexplore.ieee.org/xpl/articleDetails.jsp?arnumber=4550255>.

* cited by examiner

*Primary Examiner* — Richard Booth
(74) *Attorney, Agent, or Firm* — Scully, Scott, Murphy & Presser, P.C.

(57) ABSTRACT

A method for soldering three-dimensional integrated circuits is provided. A three-dimensional integrated circuit is heated to a base temperature, wherein the base temperature is lower than the melting point of a solder, and wherein the three-dimensional integrated circuit includes a plurality of solder bumps. A first on-chip heat source reflows a first portion of the plurality of solder bumps that is within a first local-hot-zone. A second on-chip heat source reflows a second portion of the plurality of solder bumps that is within a second local-hot-zone.

19 Claims, 5 Drawing Sheets

SOLDERING THREE DIMENSIONAL INTEGRATED CIRCUITS

BACKGROUND OF THE INVENTION

The present invention relates generally to the field of three-dimensional integrated circuits, and more particularly to soldering three-dimensional integrated circuits.

New integrated circuit technologies include three-dimensional integrated circuits (3D integrated circuits). In general, 3D integrated circuits include a plurality of vertically stacked dies, wherein the dies include processor dies, memory dies, or other types of logic dies. Through-silicon-vias (TSVs) and/or controlled collapse chip connections (C4s) connect the processor dies to a chip carrier. In a two-chip stack, for example, the bottom chip includes a plurality of TSVs that connect electronic elements of the top chip to the chip carrier. The connections are structurally strengthened by reflowing C4s (i.e., solder bumps) onto metallized contact pads on respective top surfaces of the bottom chip and the chip carrier. In some cases the C4s are a lead-free solder. Some 3D integrated circuits interface with an interposer that connects such integrated circuits to other computing devices.

3D integrated circuits provide numerous benefits. The benefits include increased areal transistor density, the ability to integrate heterogeneous dies (e.g., vertically stacking processor and memory dies), reduced power consumption, increased bandwidth (due to the ability to incorporate a large number of vias between layers), and shortened interconnections. Integrating memory dies into 3D integrated circuits takes advantage of reduced latencies provided by the relatively short lengths of TSV interconnects.

SUMMARY

According to one embodiment of the present disclosure, a method for solder three-dimensional integrated circuits is provided. The method heating a three-dimensional integrated circuit to a base temperature, wherein the base temperature is below a melting temperature of a solder, and wherein the three-dimensional integrated circuit includes a plurality of solder bumps disposed between vertically stacked dies; activating a first on-chip heat source to reflow a first portion of the plurality of solder bumps that is within a first local-hot-zone, wherein the first local-hot-zone has a temperature that is equal to or higher than the melting temperature of the solder; and activating a second on-chip heat source to reflow a second portion of the plurality of solder bumps that is within a second local-hot-zone, wherein the second local-hot-zone has a temperature that is equal to or higher than the melting temperature of the solder.

According to another embodiment of the present disclosure, a method for manufacturing a three-dimensional integrated circuit is provided. The method includes running a burn-in test on a first three-dimensional integrated circuit, wherein temporary electrical connections connect components within the first three-dimensional integrated circuit during the burn-in test, and wherein the burn-in test is run on a manufacturing fixture; responsive to the first three-dimensional integrated circuit passing the burn-in test, soldering the first three-dimensional integrated circuit on the manufacturing fixture; and responsive to the first three-dimensional integrated circuit failing the burn-in test, disassembling the first three-dimensional integrated circuit and incorporating one or more components of the first three-dimensional integrated circuit into a second three-dimensional integrated circuit.

DETAILED DESCRIPTION

Embodiments of the present disclosure recognize a need to increase the yield of 3D integrated circuit manufacturing processes. Despite the benefits that 3D integrated circuits provide, ensuring adequate electrical connections and bonding between various components (e.g., between processor dies) introduces significant complexity in the manufacturing process. Soldering is one method of electrically connecting and bonding dies within 3D integrated circuits. In general, it is desirable to test 3D integrated circuit components and electrical connections between components prior to soldering to avoid having to scrap or desolder a soldered 3D integrated circuit because of faulty components and/or electrical connections.

Embodiments of the present disclosure provide a 3D integrated circuit soldering method and manufacturing method that increases yields over traditional 3D integrated circuit manufacturing processes. The 3D integrated circuit soldering method and manufacturing method permit testing of 3D integrated circuit components and electrical connections between components prior to soldering. As a result, only functional components are soldered. Embodiments of the present disclosure also preserve the alignment of 3D integrated circuit components during and between electrical testing, burn-in testing, and soldering. The 3D integrated circuit soldering method and manufacturing method also minimize warping during soldering by monitoring temperatures within 3D integrated circuits and responsively adjusting heat flux to various portions of the 3D integrated circuits via on-chip heat sources. Persons skilled in the art will appreciate that the present disclosure can be implemented in numerous ways, including as a method, a mechanical assembly, and a system. The present disclosure will now be discussed in detail with reference to the Figures.

Figure 1:
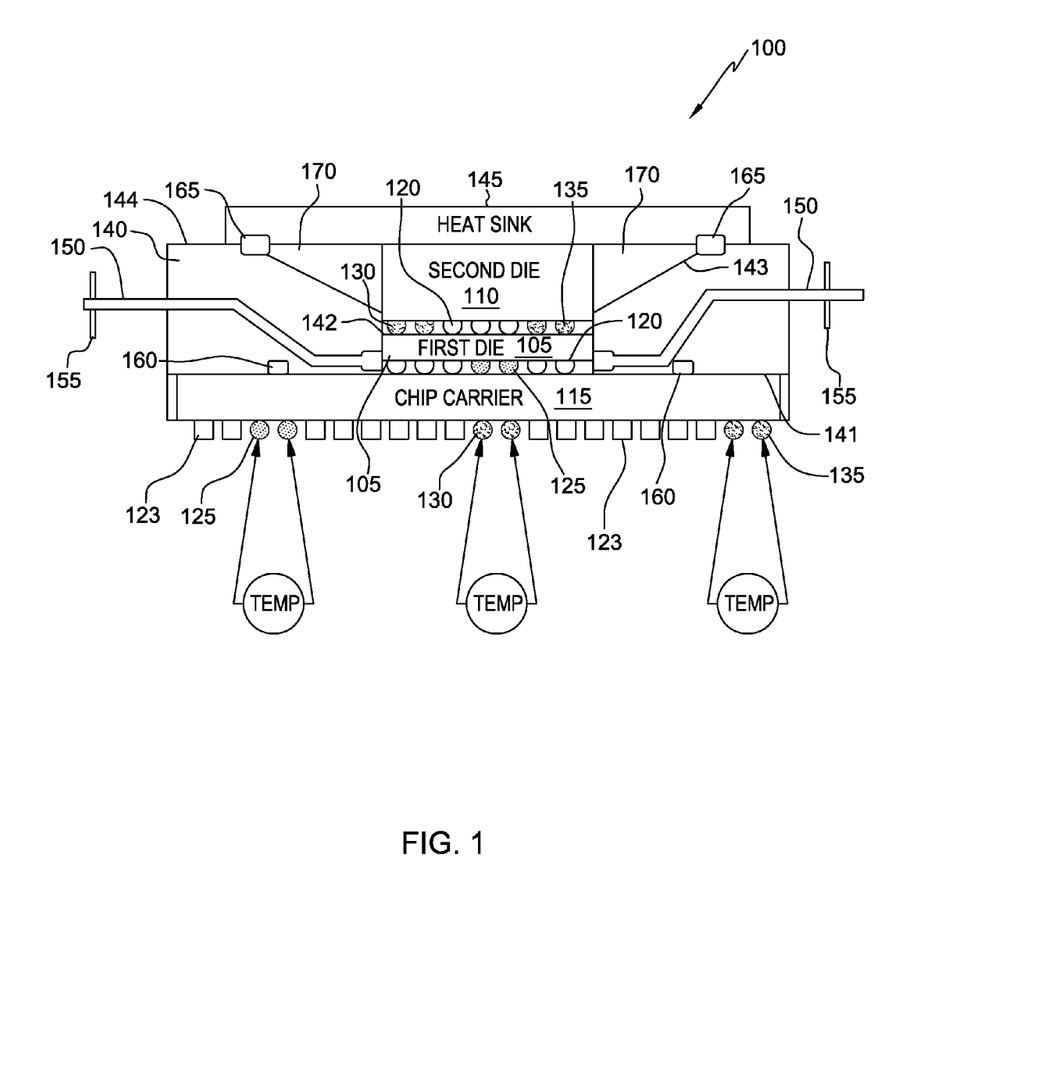
FIG. 1 is a side cut-away view depicting a cross-section of a support structure that supports a three-dimensional integrated circuit, in accordance with an embodiment of the present disclosure.
Figure 2:
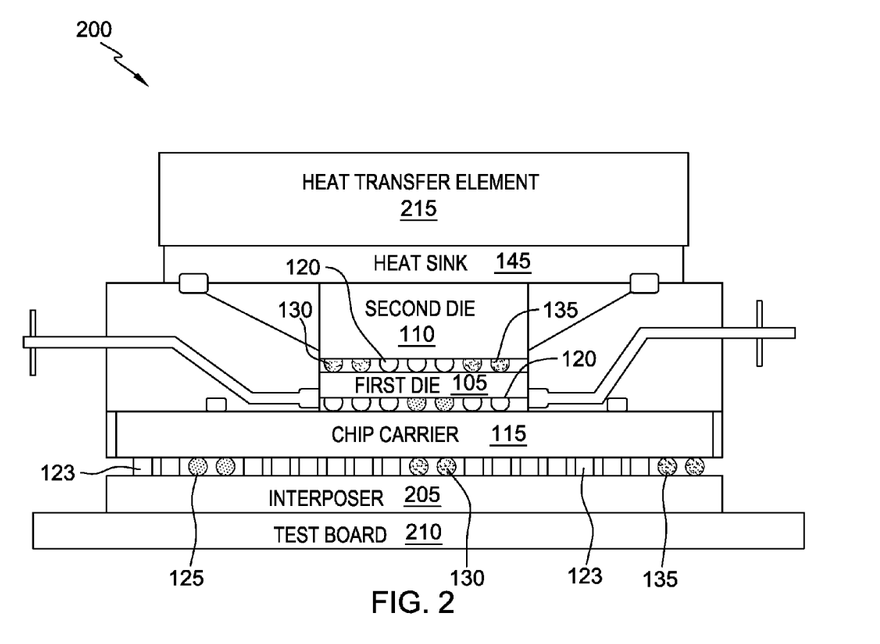
FIG. 2 is a side cut-away view depicting a cross-section of a manufacturing fixture for manufacturing for manufacturing a three-dimensional integrated circuit, in accordance with an embodiment of the present disclosure.

FIG. 1 is a side cut-away view depicting a cross-section of a support structure that supports a three-dimensional integrated circuit, in accordance with an embodiment of the present disclosure. Specifically, FIG. 1 depicts a cross-section of support structure 100, wherein support structure 100 provides vertical and horizontal support to a 3D integrated circuit that includes two vertically stacked dies. Support structure 100 is configured to support the 3D integrated circuit during and between various manufacturing and testing processes (e.g., electrical testing, burn-in testing, and soldering). The 3D integrated circuit includes first die 105, second die 110, chip carrier 115, a plurality of C4s 120, and a plurality of pin connectors 123. First die 105 is a thinned die having a plurality of TSVs (not shown for illustrative simplicity). In some embodiments, first die 105 is a processor die. In other embodiments, first die 105 is a memory die. In various embodiments, second die 110 is a thinned die or an un-thinned die. In some embodiments, second die 110 is a processor die. In other embodiments, second die 110 is a memory die. C4s 120 electrically and mechanically connect first die 105 to second die 110 and first die 105 to chip carrier 115. During various pre-soldering manufacturing processes (e.g., electrical testing and burn-in testing), these connections are temporary and enable replacement of one or more dies depending on the results of various tests, as described herein. FIGS. 1 and 2 include a limited number of C4s for illustrative simplicity. Other embodiments have a larger number of C4s. In addition, the top and bottom surfaces of first die 105, the bottom surface of second die 110, and the top surface of chip carrier 115 have metallized contact pads (not shown) to facilitate electrical connections between C4s 120 and respective TSVs. In some manufacturing and testing processes, C4s 120 facilitate temporary electrical connections between external computing devices and electronic components of first die 105 and second die 110. During a soldering process, C4s 120 join and electrically connect second die 110 to first die 105 and first die 105 to chip carrier 115, as described herein. In the embodiment depicted in FIG. 1, pin connectors 123 are disposed on the bottom surface of chip carrier 115. Pin connectors 123 electrically connect the 3D integrated circuit to manufacturing fixtures 200, as discussed with respect to FIG. 2. In other embodiments, chip carrier 115 is soldered to a circuit board (e.g., using a plurality of C4s disposed on the bottom surface of chip carrier 115) and pin connectors 123 are omitted.

A portion of C4s 120 and pin connectors 123 facilitate electrical connections to thermal diodes during 3D integrated circuit testing and/or manufacturing processes. In the embodiment depicted in FIG. 1, for example, a first thermal diode (not shown) is embedded in first die 105. A second thermal diode (not shown) and a third thermal diode (not shown) are embedded in second die 110. First thermal diode connectors 125 facilitate electrical connections to the first thermal diode. Similarly, second thermal diode connectors 130 and third thermal diode connectors 135 respectively facilitate electrical connections to the second thermal diode and the third thermal diode. Persons of ordinary skill in the art will understand that the voltage across a thermal diode varies with temperature. Consequently, temperatures within first die 105 and second die 110 are monitored by determining respective voltages across first thermal diode connectors 125, second thermal diode connectors 130, and third thermal diode connectors 135. Second thermal diode connectors 130 and third thermal diode connectors 135 are also disposed between first die 105 and chip carrier 115 but are not shown in cross-section of the 3D integrated circuit that is depicted in FIG. 1. Other embodiments of the present disclosure include a greater number of thermal diodes to provide increased temperature resolution within the 3D integrated circuit during various testing and manufacturing processes.

In the embodiment depicted in FIG. 1, chip carrier 115 resides in recess 141 of chip holder 140. As described herein, a pressure differential, at least in part, holds chip carrier 115 in recess 141. In some embodiments, a mechanical connector, an adhesive bond, electrostatic attraction, magnetic attraction, and/or another technique for connecting surfaces, alone or in combination with the pressure differential, holds chip carrier 115 in recess 141. Among other things, recess 141 provides lateral support to chip carrier 115. Chip holder 140 has inner side walls 142 that also provide lateral support to the 3D integrated circuit. Inner side walls 142 define an aperture that is sized to receive a portion of the 3D integrated circuit (e.g., first die 105 and second die 110). Inner side walls 142 extend vertically from recess 141 and follow the edge of first die 105 and a portion of the edge of second die 110. The distances between inner side walls 142 and the edges of first die 105 and second die 110 are less than the pitch of C4s 120. In general, the dimensions of inner side walls 142 and the aperture that they define are such that inner side walls 142 substantially keep the horizontal alignment of first die 105, second die 110, and chip carrier 115 within acceptable tolerances. Persons of ordinary skill the art will understand that first die 105, second die 110, and chip carrier 115 are aligned such that a sufficient number of soldered C4s 120 form operable electrical connections with the contact pads of first die 105 and chip carrier 115. In some embodiments, various redundant electrical pathways provide resiliency in the event that some C4s do not form operable electrical connections with respective contact pads.

In the embodiment depicted in FIG. 1, chip holder 140 has angled side walls 143 and top surface 144. Angled side walls 143 extend upwardly and outwardly from top edges of inner side walls 142 to top surface 144 such that angled side walls 143 define an inverted square frustum. Support structure 100 includes heat sink 145. A portion of heat sink 145 is connected to top surface 144. Chip holder 140 is configured such that another portion of heat sink 145 is in contact with a top surface of second die 110. In some embodiments, a fluid or malleable compound having high thermal conductivity is disposed between the bottom surface of heat sink 145 and the top surface of second die 110 to improve heat transfer between heat sink 145 and second die 110. Heat sink 145, chip carrier 115, and chip holder 140 define, at least in part, cavity 170. Cavity 170 is irregularly shaped and includes spaces between first die 105 and chip carrier 115, spaces between first die 105 and second die 110, and spaces between second die 110 and chip holder 140.

Persons of ordinary skill in the art will understand that applying a homogenous force to the 3d integrated circuit generally decreases warping, promotes better electrical and mechanical connections between various components, thereby increasing manufacturing yields. Creating a pressure differential between isolated fluids is one technique for applying a homogenous force over an area. In embodiments like the one depicted in FIG. 1, for example, an imperfect vacuum exists in cavity 170. In such embodiments, trace amounts of an inert gas are present in cavity 170. The inert gas is one of, but not limited to, argon, helium, or nitrogen in various embodiments. In general, cavity 170 has a pressure that is less than the pressure of an external atmosphere. Therefore, a pressure differential exists between cavity 170 and the external atmosphere. In one embodiment, the pressure differential is approximately one atmosphere. In some embodiments, the pressure differential is higher than approximately one atmosphere during some testing and manufacturing processes (e.g., processes where support structure 100 is placed in a pressure chamber that is cable of withstanding pressures greater than one atmosphere). The pressure differential creates substantially homogenous forces that bring first die 105, second die 110, chip carrier 115, and a portion of C4s 120 into physical contact. In general, the pressure differential, in combination with inner side walls 142, is high enough to keep the alignment of first die 105, second die 110, and chip carrier 115 within acceptable tolerances during and between various testing and manufacturing processes. In some embodiments, the pressure differential provides sufficient force to facilitate electrical connections between first die 105 and chip carrier 115 and between first die 105 and second die 110. In other embodiments, additional force(s) bring first die 105, second die 110, and chip carrier 115 into electrical contact via C4s 120.

In the embodiment depicted in FIG. 1, a plurality of vacuum tubes 150 are disposed within chip holder 140. Inner side walls 142 include a plurality of apertures through which vacuum tubes 150 communicate with cavity 170. In some embodiments, vacuum tubes 150 are physically separate from chip holder 140 and extend from outer side walls of chip holder 140. In other embodiments, vacuum tubes 150 are channels within chip holder 140. Valves 155 selectively isolate cavity 170 and the interior of vacuum tubes 150 from the external atmosphere. Support structure 100 includes a plurality of flexible gaskets that further isolate cavity 170 from the external atmosphere. First flexible gasket 160, for example, is disposed in recess 141. Under pressure from chip carrier 115, first flexible gasket deforms and creates a substantially impermeable seal between chip carrier 115 and chip holder 140. Similarly, second flexible gasket 165 is disposed on top surface 144 of chip holder 140. Under pressure from heat sink 145, second flexible gasket 165 deforms and creates a substantially impermeable seal between heat sink 145 and chip holder 140. Fluids within cavity 170 are evacuated through vacuum tubes 150 and valves 155 to create the pressure differential. When closed, valves 155 create seals that, in combination with the seals created by first flexible gaskets 160 and second flexible gasket 165, maintain the pressure differential between cavity 170 and the external atmosphere within acceptable tolerances. The magnitude of the pressure differential is selected to, at least in part, maintain the alignment of first die 105, second die 110, and chip carrier 115 as descried herein. In some embodiment, the vacuum is maintained during soldering to minimize oxidation at elevated temperatures. In addition, soldering under a vacuum, or at least a partial vacuum, reduces the amount of flux used during soldering, if any. Preheated flux can be introduced into cavity 170 via one or more of vacuum tubes 150.

FIG. 2 is a side cut-away view depicting a cross-section of a manufacturing fixture for manufacturing for manufacturing a three-dimensional integrated circuit, in accordance with an embodiment of the present disclosure. Specifically, FIG. 2 depicts support structure 100 on manufacturing fixture 200, in accordance with an embodiment of the present disclosure. Manufacturing fixture 200 performs burn-in testing and soldering processes. Performing burn-in testing and soldering processes on manufacturing fixture 200 eliminates the need to disassemble a functional 3D integrated circuit for soldering and/or transport a functional 3D integrated circuits to a soldering station following burn-in testing. Eliminating disassembly and/or transportation steps reduces the probability that components of functional 3D integrated circuits will become misaligned between burn-in testing and soldering. In some embodiments, however, manufacturing fixture 200 performs soldering processes, but burn-in testing is performed on another fixture. Manufacturing fixture 200 is also capable of verifying the integrity of electrical connections between components of soldered 3D integrated circuits in some embodiments.

Manufacturing fixture 200 includes interposer 205, test board 210, and heat transfer element 215. FIG. 2 omits some elements of manufacturing fixture 200 (e.g., structural supports, various computing devices, and various electrical and mechanical connections) for illustrative simplicity. Interposer 205 electrically connects chip carrier 115 to test board 210. The electrical connections between chip carrier 115 and interposer 205 are temporary electrical connections. In some embodiments, pin connectors 123 are pogo pins. Persons of ordinary skill in the art will readily understand that pogo pins are capable of providing temporary electrical connections between computing devices. Pin connectors 123 and interposer 205 permit support structure 100 to be removed from manufacturing fixture 200. If, for example, one or both of first die 105 and second die 110 fail during burn-in testing, support structure 100 is removed from manufacturing fixture 200, support structure 100 is disassembled, and one or both of first die 105 and second die 110 are replaced (prior to soldering, the connections between first die 105 and second die 110 and between first die 105 and chip carrier 115 are temporary as well). Pin connectors 123 interface with metalized contact pads (not shown) that are disposed on the top surface of interposer 205. Some embodiments of manufacturing fixture 200 include one or more mechanisms that provide force(s) to bring pin connectors 123 into electrical contact with the metalized contact pads of interposer 205. In one example of such an embodiment, one or more hydraulic or pneumatic pistons press support structure 100 against manufacturing fixture 200. Persons of ordinary skill in the art will understand that applying homogenous force(s) to support structure 100 advantageously decreases warping of 3D integrated circuit components (e.g., first die 105 and second die 110) during soldering. Other embodiments of manufacturing fixture 200 include different mechanisms for bringing pin connectors 123 into electrical contact with interposer 205. In yet other embodiments, the weight of support structure 100 and/or elements of manufacturing fixture 200 (e.g., heat transfer element 215) is sufficient to bring pin connectors 123 into electrical contact with interposer 205. Interposer 205 is omitted in some embodiments of manufacturing fixture 200. In such embodiments, chip carrier 115 directly interfaces with test board 210.

Test board 210 electrically connects first die 105 and second die 110 to various computing and/or diagnostic devices during solderless electrical testing, burn-in testing, and soldering. During burn-in testing, for example, test board 210 connects first die 105 and second die 110 to various computing device that perform operations on first die 105 and second die 110, wherein first die 105 and second die 110 are processor dies. Test board 210 also enables soldering of second die 110 to first die 105 and first die 105 to chip carrier 115 using various types of on-chip heat sources, as described herein. To deliver electrical power, test board 210 is connected to one or more power supplies (not shown) of manufacturing fixture 200. Test board 210 also enables manufacturing fixture 200 to determine the temperature of on-chip thermal diodes that are integrated into the 3D integrated circuit (e.g., via one or more devices that are configured to measure voltages across first thermal diode connectors 125, second thermal diode connectors 130, and third thermal diode connectors 135 at constant current).

Persons or ordinary skill in the art will readily understand that it is advantageous to remove heat from 3D integrated circuits during burn-in testing. Conversely, persons of ordinary skill in the art will readily understand that soldering requires sufficient heat to melt a solder. In the embodiment depicted in FIG. 2, heat transfer element 215 is physically and thermally connected to heat sink 145. In general, heat transfer element 215 extracts heat from heat sink 145 during burn-in testing and supplies heat to heat sink 145 during soldering. Heat sink 145 transfers heat to and from first die 105 and second die 110. In some embodiments, heat transfer element 215 includes at least one thermoelectric device (e.g., a Peltier heat pump) that is capable of operating in heating or cooling modes, wherein heat transfer element 215 is operably connected to one or more external power supplies and/or loads (not shown) to facilitate thermoelectric heat transfer. Person of ordinary skill in the art will readily understand that a thermoelectric device provides control of the heat flux across the device. In other embodiments, heat transfer element 215 is a passive thermal conductor that transfers heat to or from a fluid. In one example of such an embodiment, heat transfer element 215 is a metallic block that is one element of a liquid cooling/heating system (e.g., a heat transfer block, a reservoir, a radiator, and a pump that are connected via liquid supply lines), wherein a liquid passes through heat transfer element 215. In this example, heat transfer element 215 extracts heat from, or supplies heat to, heat sink 145 depending on the temperature differential between heat sink 145 and the liquid. The liquid is heated or cooled depending on the desired mode of operation. In yet other embodiments, heat transfer element 215 includes at least one thermoelectric device and a liquid cooling/heating system, wherein the liquid cooling/heating system provides control over the temperature differential across the thermoelectric device(s). In general, heat transfer element 215 functions as an "external" heat source during soldering. Heat transfer element 215 is an "external" heat source because it is not integrated with the 3D integrated circuit. In contrast, various embodiments of the present disclosure include 3D integrated circuits having internal, on-chip heat sources, as discussed herein.

Embodiments of manufacturing fixture 200 that perform burn-in testing and soldering advantageously eliminate the need to disassemble functional 3D integrated circuits prior to soldering. While manufacturing fixture 200 thereby reduces the probability that the components of a functional 3D integrated circuit will become misaligned between burn-in testing and soldering, warping of one or more components during soldering has the potential to render the 3D integrated circuit defective. To reduce the probability that 3D integrated circuit components will warp during soldering and ensure adequate solder connections, manufacturing fixture 200 is configured to manage a plurality of on-chip heat sources within the 3D integrated circuit and monitor temperatures within the 3D integrated circuits via thermal diodes.

Manufacturing fixture 200 utilizes a two-step soldering process. In a first step, the 3D integrated circuit is heated to a base temperature that is below the melting point of the solder (e.g., C4s 120). If, for example, the solder (e.g., a lead-free solder) has a melting temperature of 235° C., manufacturing fixture 200 heats the 3D integrated circuit to approximately 215° C. In general, the base temperature is any temperature from which on-chip heat sources, as described herein, have the capability to raise one or more portions of the 3D integrated circuit to a temperature that is equal to or higher than the melting point of the solder. In some embodiments, heat transfer element 215 provides heat to bring the temperature of the 3D integrated circuit to the base temperature. In other embodiments, on-chip heat sources provide heat to bring the temperature of the 3D integrated circuit to the base temperature. In yet other embodiments, both heat transfer element 215 and on-chip heat sources provide heat to bring the temperature of the 3D integrated circuit to the base temperature. In one example of such embodiments, heat transfer element 215 provides coarse temperature adjustments and on-chip heat sources provide fine temperature adjustments, wherein power to heat transfer element 215 and the on-chip heat sources is adjusted in response to voltages across on-chip thermal diodes.

In a second step, a plurality of on-chip heat sources sequentially raise the temperature of one or more portions of the 3D integrated circuit above the melting temperature of the solder (e.g., 235° C.) in accordance with a location-dependent heating profile. In other words, the second step is a repetitive step, wherein a moving local-hot-zone melts only a portion of solder contacts (e.g., C4s 120) at any one time. Warping is reduced in the second step because the entire 3D integrated circuit is at a relatively high temperature (e.g., 215° C.) compared to the melting temperature of the solder (e.g., 235° C.), which reduces the temperature differentials and thus thermal stresses across the 3D integrated circuit. Monitoring temperatures within the 3D integrated circuit (e.g., via first, second, and third thermal diode connectors 125, 130 and 135) enables manufacturing fixture 200 to manage the on-chip heat sources so as to compensate for varying heat flows through the 3D integrated circuit. In embodiments where on-chip heat sources provide at least some of the heat to bring the 3D integrated circuit up to the base temperature, manufacturing fixture 200 is able to reduce power to on-chip heat sources in the vicinity of the local-hot-zone if local temperatures exceed the base temperature or another threshold temperature. Similarly, manufacturing fixture is able to reduce power to on-chip heat sources within the local-hot-zone in order to prevent damage to the 3D integrated circuit if temperatures exceed a threshold temperature above the melting point of the solder (e.g., if the thermal design power of the 3D integrated circuit is exceeded).

In some embodiments, the plurality of on-chip heat sources includes discrete resistive heaters (e.g., shunt resistors) that are integrated into the 3D integrated circuit. The resistive heaters act as local, built-in soldering irons. In one example of such embodiments, the resistive heaters receive power via a portion of pin connectors 123, wherein power to the resistive heaters is managed independently of power to the 3D integrated circuit dies (e.g., power to processor cores on first die 105 and second die 110). In another example of such embodiments, the resistive heaters receive power via on-die power planes, wherein power variation is achieved via pulse-width modulation. Powering the resistive heaters using on-die power planes eliminates the need to utilize a portion of pin connectors 123 solely to power the resistive heaters (i.e., pins connectors that only power the resistive heaters and are not used during normal operation of the 3D integrated circuit).

In other embodiments, the plurality of on-chip heat sources includes processor cores within the 3D integrated circuit that provide heat for soldering and/or bringing the 3D integrated circuit up to the base temperature. In one example of such embodiments, an electrical current is selectively supplied to individual processor cores that are in the quiescent state (i.e., while logic gate inputs are held constant) to generate heat. In this example, heat output is adjusted by switching the power header gates of respective processor cores on and off. Persons of ordinary skill in the art will readily understand that this is analogous to performing Iddq testing on individual processor cores. In another example of such embodiments, individual processor cores are operated in a functional mode. In one such example, a scan pattern is executed on one or more processor cores, wherein the scan pattern provides logic gates with one or more combinations of inputs (i.e., the scan pattern turns individual transistors on and off) without regard to the outputs of the logic gates (i.e., the electronic components of the processors are merely used as heat sources). Persons of ordinary skill in the art will understand that different scan patterns produce different amounts of heat. A more stressful scan pattern simultaneously activates more transistors at a time and produces more heat than a less stressful scan pattern, wherein fewer transistors are simultaneously active at a time. In this example, the amount of heat produced by a processor core is regulated by the type of scan pattern (e.g., the number of transistors that the scan pattern activates at a time). The heat distribution is adjusted by activating transistors in specific portions of one or more processor cores and/or dies. In another example of an embodiment where processors cores are operated in a functional mode, one or more processor cores execute one or more computer programs (e.g., one or more benchmarking programs). This functional mode differs from executing scan patterns in that the one or more computer programs provide inputs to logic gates based, at least in part, on the logical outputs of other logic gates. Persons of ordinary skill in the art will understand that the amount of heat generated by a processor executing a computer program is a function of the computational intensity of the computer program. In this example, the heat output is adjusted by implementing a more or less stressful program (e.g., a benchmarking program) to respectively increase or decrease the amount of heat generated. A more stressful computer program involves a greater average number of instructions per second and produces more heat than a less stressful computer program that involves a lesser average number of instructions per second. Persons of ordinary skill in the art will also understand that increasing or decreasing the voltage to a processor core increases or decreases the amount of heat generated in the quiescent state and while executing scan patterns and computer programs.

In yet other embodiments, the plurality of on-chip heat sources includes a combination of discrete resistive heaters (e.g., shunt resistors) and processor cores that generate heat in the quiescent state and/or processor cores executing scan patterns and/or computer programs.

Figure 3:
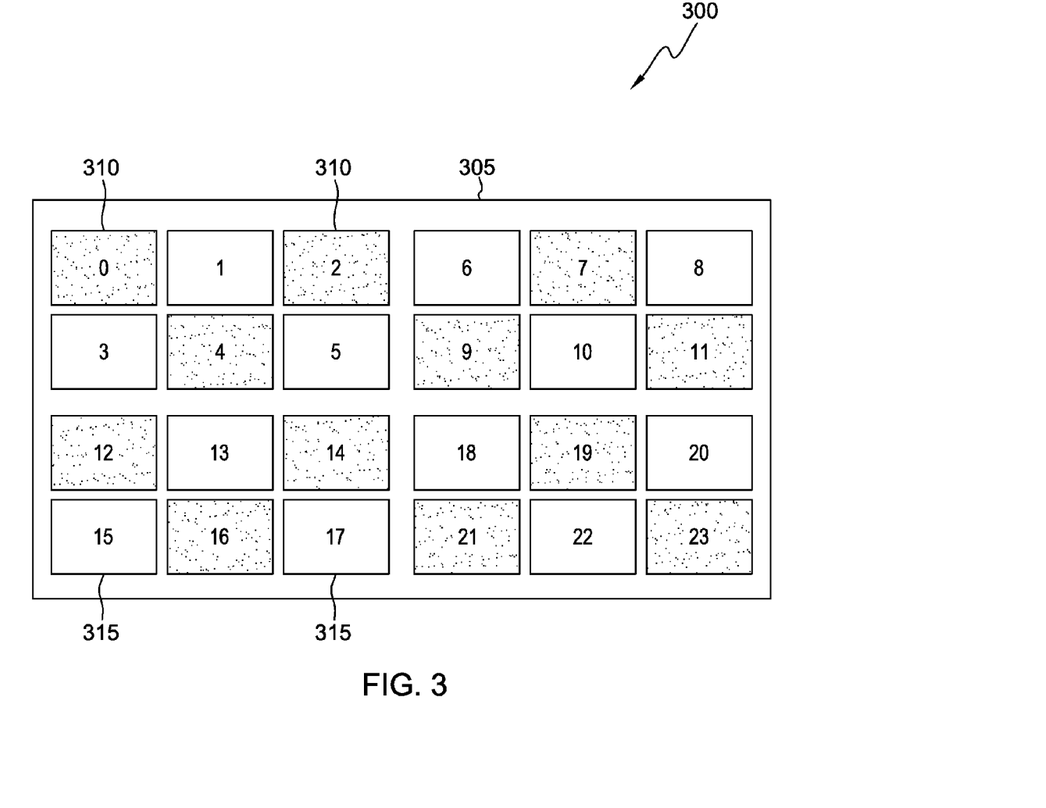
FIG. 3 depicts an overhead view of a location dependent heating profile of a step in a soldering process for soldering a three-dimensional integrated circuit that includes a process dies having multiple processor cores, in accordance with an embodiment of the present disclosure.

FIG. 3 depicts an overhead view of a location dependent heating profile of a step in a soldering process for soldering a three-dimensional integrated circuit that includes a process dies having multiple processor cores, in accordance with an embodiment of the present disclosure. More specifically, FIG. 3 depicts soldering pattern 300. Soldering pattern 300 is one example of various heat dependent heating profiles for minimizing warping during soldering. FIG. 3 includes processor die 305 having 24 processor cores (numbered zero to twenty three), wherein processor die 305 is one die of a 3D integrated circuit having multiple vertically stacked dies. In the embodiment depicted in FIG. 3, processor die 305 and the processor cores have been heated to at least the base temperature (e.g., 215° C.). Processor cores 310 are processors cores that are providing heat (i.e., processor cores that generate heat in the quiescent state and/or processor cores executing scan patterns and/or computer programs) in order to create local-hot-zones that melt solder contacts (e.g., C4s 120) in the vicinity of processor cores 310. In various embodiments, processor cores 315 are processor cores that are inactive or supplying heat to the extent necessary to keep temperatures in the vicinity of processor cores 315 at the base temperature or below another threshold temperature.

Soldering pattern 300 alternates between processor cores 310 and processor cores 315. This pattern enables high throughput because half of all processor cores are within respective local-hot-zones at any one time. Soldering pattern 300 also spreads thermal stresses over most of first die 105. In general, it is possible to solder 3D integrated circuits using another pattern of alternating hot and relatively cool zones (e.g., base temperature zones). In one example of such an embodiment, each local-hot-zone includes a group of processor cores (i.e., the pattern is implemented at a coarser level of granularity). In another example of such an embodiment, each local-hot-zone covers an area that corresponds with less than one processor core (i.e., the pattern is implemented at a finer level of granularity). Persons of ordinary skill in the art will understand that a variety of soldering patterns are possible utilizing on-chip heat sources.

Figure 4:
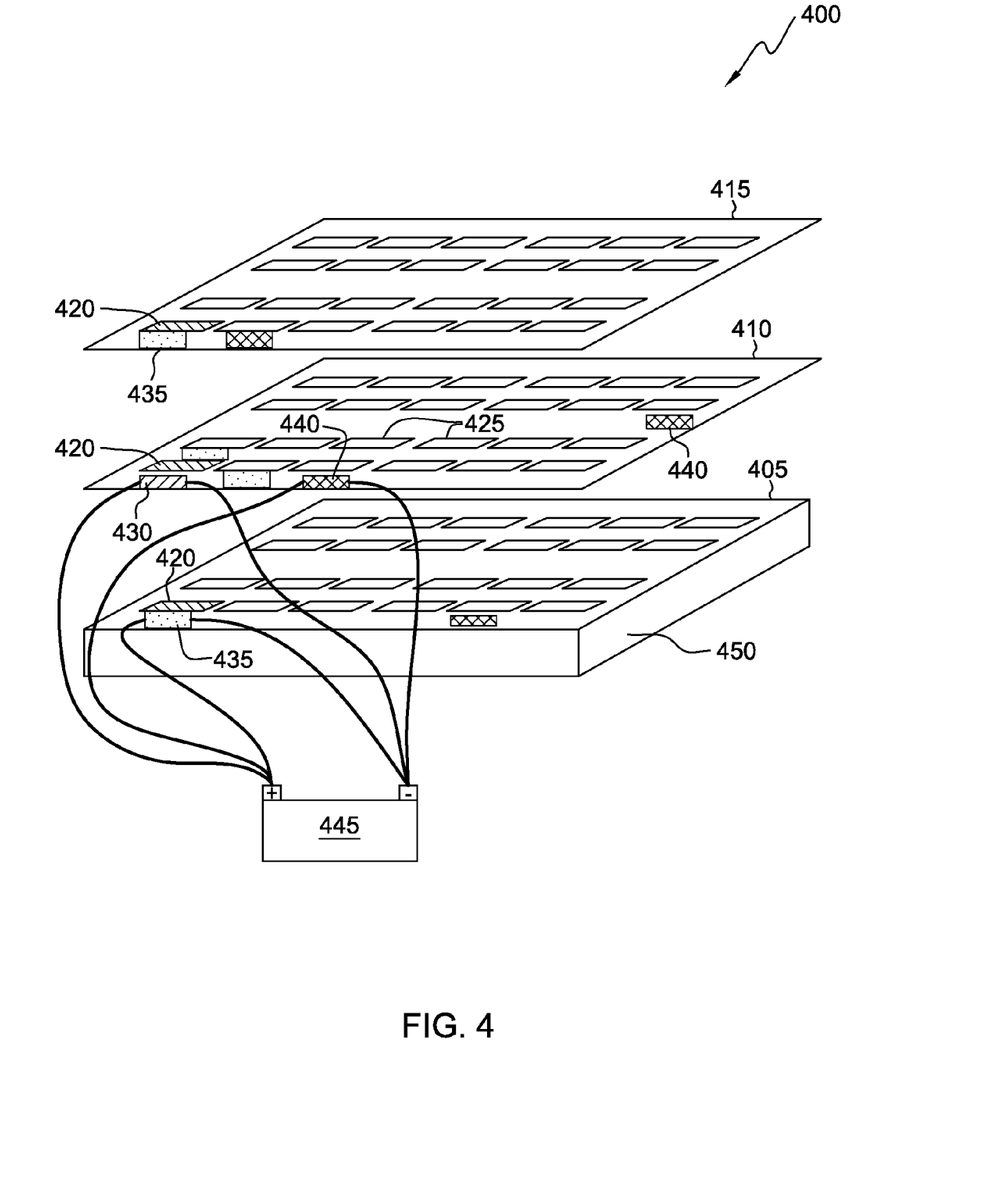
FIG. 4 is a perspective depicting an exploded view of a three-dimensional integrated circuit having a plurality of on-chip heat sources, in accordance with an embodiment of the present disclosure.

FIG. 4 is a perspective depicting an exploded view of a three-dimensional integrated circuit having a plurality of on-chip heat sources, in accordance with an embodiment of the present disclosure. Specifically, FIG. 4 depicts a soldering step on an exploded view of 3D integrated circuit 400. The soldering step depicted in FIG. 4 is one step in a process for soldering 3D integrated circuit 400 on manufacturing fixture 200, in accordance with an embodiment of the present disclosure. 3D integrated circuit 400 includes bottom die 405, middle die 410, and top die 415. 3D integrated circuit 400 also includes C4s (e.g., C4s 120, not shown) between top die 415 and middle die 410 and between middle die 410 and bottom die 405. The soldering step depicted in FIG. 4 solders together a portion of each of bottom die 405, middle die 410, and top die 415. Bottom die 405 is soldered to chip carrier 450 in FIG. 4. Each of bottom die 405, middle die 410, and top die 415 includes one of processor cores 420. Processor cores 420 are three vertically aligned processor cores within a local-hot-zone. Each of bottom die 405, middle die 410, and top die 415 also include a plurality of unsoldered processor cores 425. 3D integrated circuit 400 includes high power resistive heater 430, medium power resistive heaters 440 (only a few of which are shown in FIG. 4), and low power resistive heaters 435. The aforementioned resistive heaters are respectively connected to power supply 445. In general, power supply 445 is a single power supply or a combination of power supplies that provide different amounts of power to high power resistive heater 430, medium power resistive heaters 440, and low power resistive heaters 435. High power resistive heater 430, medium power resistive heaters 440, and low power resistive heaters 435 only differ in the amount of power that is supplied to them. In one example, the resistive heaters are shunt resistors. Moreover, 3D integrated circuit 400 includes a sufficient number of resistive heaters to fully solder bottom die 405 to middle die 410 and middle die 410 to top die 415. Only one of each of medium power resistive heaters 440 and low power resistive heaters 435 is shown with connections to power supply 445 for illustrative simplicity. In addition, FIG. 4 depicts wires that connect power supply 445 to the various resistive heaters for illustrative simplicity. As previously discussed, on-chip heat sources are provided with power via a chip carrier (e.g., chip carrier 450), various TSVs, and manufacturing fixture 200.

The soldering step depicted in FIG. 4 utilizes a combination of heat transfer element 215 and on-chip heat sources to keep 3D integrated circuit 400 at the base temperature or above another threshold temperature. In one example, medium power resistive heaters 440, for example, prevent, at least in part, bottom die 405, middle die 410, and top die 415 from falling below the base temperature. High power resistive heater 430, on the other hand, creates a local-hot-zone that encompasses each of processor cores 420. High power resistive heater 430 raises the temperature of the local-hot-zone above the melting temperature of the C4s, thereby melting the portion of the C4s that is within the local-hot-zone. The embodiment depicted in FIG. 4 utilizes high power resistive heater 430 and low power resistive heaters 435 to keep temperatures within the local-hot-zone within the thermal design power of the 3D integrated circuit. Low power resistive heaters 435 surround the local-hot-zone. Manufacturing fixture 200 manages power supply 445, and thus high power resistive heater 430, medium power resistive heaters 440, and low power resistive heaters 435 in response to temperature readings from thermal diodes that are integrated into bottom die 405, middle die 410, and top die 415 (e.g., via thermal diode connectors 125, 130, and 135). Manufacturing fixture 200 manages power supply 445 so as to solder one or more of processor cores 420 while a plurality of processor cores (e.g., unsoldered processor cores 425) remain unsoldered. Persons of ordinary skill in the art will readily understand that in various embodiments, various heat sources (e.g., medium and lower power resistive heaters 440 and 435) are managed so as to keep unsoldered processor cores 425 at the base temperature and below the melting temperature of the solder, as discussed herein.

Figure 5:
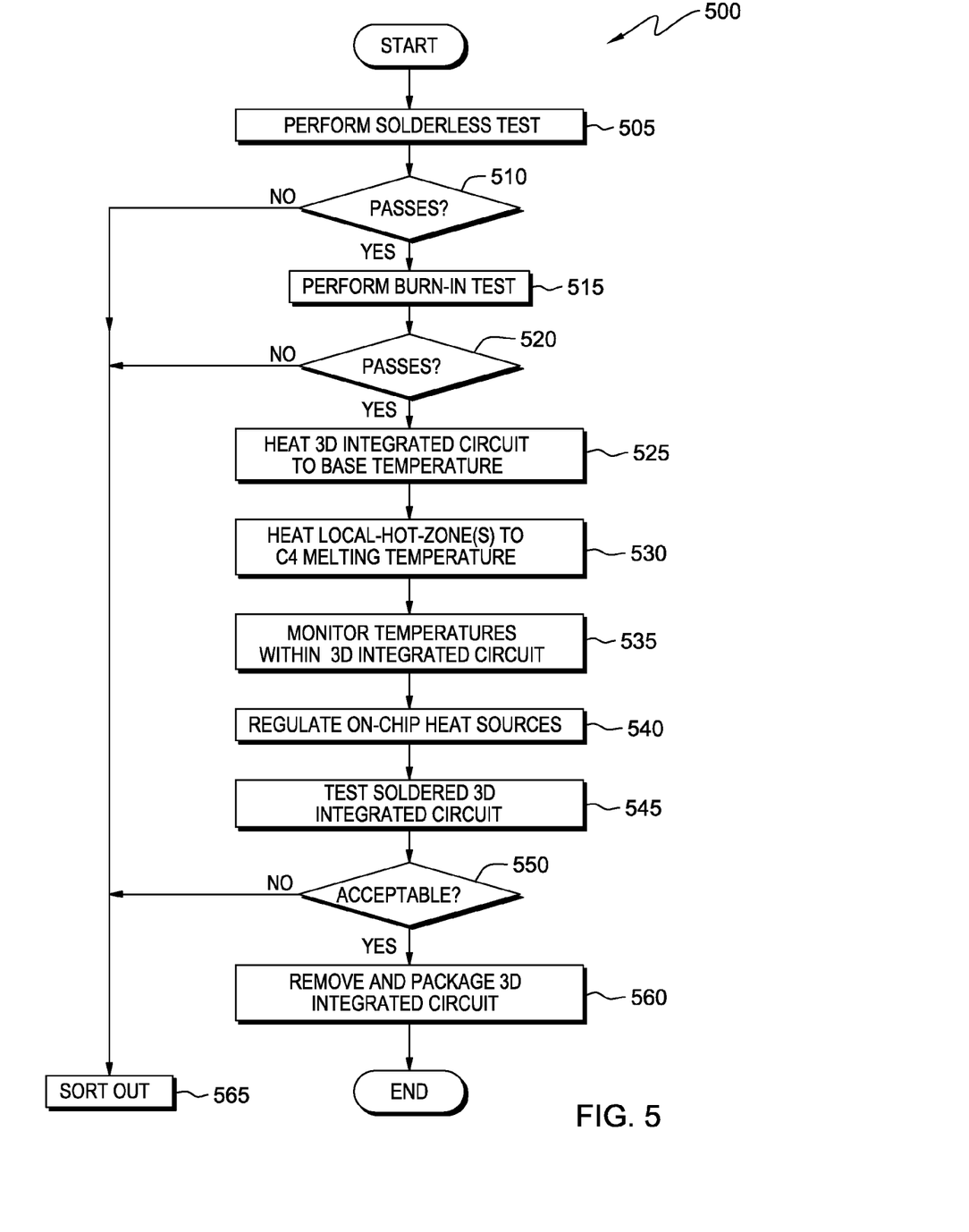
FIG. 5 is a flowchart depicting a method for manufacturing a 3D integrated circuit, in accordance with an embodiment of the present disclosure.

FIG. 5 is a flowchart that depicts manufacturing method 500, in accordance with an embodiment of the present disclosure. Manufacturing method 500 is a method for manufacturing a 3D integrated circuit using support structure 100 in combination with manufacturing fixture 200. In general, manufacturing method 500 is a method for soldering a 3D integrated circuit after the 3D integrated circuit passes one or more tests.

In step 505, manufacturing fixture 200 performs a solderless test on a 3D integrated circuit that is contained within support structure 100 (e.g., a 3D integrated circuit that includes first die 105, second die 110, and chip carrier 115 as depicted in FIG. 1). The solderless test tests the components of the 3D integrated circuit. The solderless test also tests the integrity of the electrical connections between the components of the 3D integrated circuit. Support structure 100 and manufacturing fixture 200 create temporary electrical connections between the components of the 3D integrated circuit, as discussed herein.

In decision 510, manufacturing fixture 200 determines whether or not the 3D integrated circuit passes the solderless test. Persons of ordinary skill in the art will understand that 3D integrated circuits fail the solderless test for a variety of reasons. In one example, the 3D integrated circuit is nonfunctional because one or more of the components are nonfunctional. In another example, the 3D integrated circuit is nonfunctional because the alignment between two or more components is not within acceptable tolerances. In yet another example, the 3D integrated circuit is nonfunctional because the pitch between one or more pairs of C4s is not within acceptable tolerances. In some embodiments, manufacturing fixture 200 determines which components are functional, if any, and which components are nonfunctional. If manufacturing fixture 200 determines that the 3D integrated circuit passes the solderless test (decision 510, YES branch), manufacturing fixture 200 performs step 515. If manufacturing fixture 200 determines that the 3D integrate circuit fails the solderless test (decision 510, NO branch), manufacturing fixture performs step 565. In some embodiments, another manufacturing fixture (i.e., not manufacturing fixture 200) performs step 505 and decision 510, and the 3D integrated circuit is transported to manufacturing fixture 200 within support structure 100 prior to burn-in testing.

In step 565, the 3D integrated circuit is disassembled and the components are sorted out. In this step functional components are sorted out for reuse and nonfunctional components are discarded. In some embodiments, manufacturing fixture 200 heats the 3D integrated circuit via on-chip heat sources to desolder one or more components of the 3D integrate circuit. Desoldered components are reused if functional or discarded in nonfunctional.

In step 515, the 3D integrated circuit is subjected to one or more burn-in tests. During burn-in tests, heat transfer element 215 removes heat from the 3D integrated circuit. Persons of ordinary skill in the art will understand that the burn-in tests are designed to cause a portion of all 3D integrated circuits to fail during burn-in testing so that the reliability of packaged 3D integrated circuits is increased due to early lifetime failure acceleration. In the embodiment depicted in FIG. 5, manufacturing fixture 200 performs both burn-in testing and soldering. In some embodiments, burn-in testing and soldering is performed on different manufacturing fixtures. In one example of such an embodiment, the 3D integrated circuit is transported within support structure 100 for soldering on manufacturing fixture 200 following burn-in testing on a different manufacturing fixture.

In decision 520, manufacturing fixture 200 determines whether or not the 3D integrated circuit passes burn-in testing. The 3D integrated circuit passes burn-in testing if the components of the 3D integrated circuit do not fail during burn-in testing. If manufacturing fixture 200 determines that the 3D integrated circuit passes burn-in testing (decision 520, YES branch), manufacturing fixture 200 performs step 525. If manufacturing fixture 200 determines that the 3D integrate circuit fails burn-in testing (decision 520, NO branch), step 565 is performed.

In general, steps 525, 530, 535, and 540 are steps of a method for soldering. These steps include various aspects of the methods for soldering discussed with respect to FIGS. 2, 3, and 4.

In step 525, the 3D integrated circuit is heated to a base temperature. As discussed herein, the base temperature is a temperature that is below the melting point of the C4s of the 3D integrated circuit. Heat is supplied to the 3D integrated circuit via one or both of heat transfer element 215 and on-chip heat sources.

In step 530, manufacturing fixture 200 manages on-chip heat source so as to heat one or more local-hot-zones to the melting temperature of the C4s in accordance with a location-dependent heat profile, as discussed herein with respect to FIGS. 2, 3, and 4.

In step 535, manufacturing fixture 200 monitors temperatures within the 3D integrated circuit. The 3D integrated circuit includes on-chip thermal diodes (e.g., first, second, and third thermal diodes as discussed with respect to FIG. 1) and thermal diode connectors that electrically connect the thermal diodes to manufacturing fixture 200 (e.g., first, second, and third thermal diode connects 125, 130, and 135). Manufacturing fixture 200 determines the temperate of the thermal diodes via one or more voltmeters that determine the voltage across the thermal diodes, as discussed herein.

In step 540, manufacturing fixture 200 regulates the on-chip heat sources. In one example, manufacturing fixture 200 reduces power to on-chip heat sources in the vicinity of the local-hot-zone(s), in order to keep temperatures within the 3D integrated circuit within the thermal design power of the 3D integrated circuit. Manufacturing fixture 200 adjusts the on-chip heat sources based, at least in part, on the temperatures of the on-chip thermal diodes. In some embodiments, step 540 includes sequentially moving the local-hot-zones to various portions of the 3D integrated circuit until soldering is complete, in accordance with the location-dependent heating profile.

In step 545, manufacturing fixture 200 tests the soldered 3D integrated circuit. In this test, manufacturing fixture 200 tests, among other things, the integrity of the soldered connections between various components of the 3D integrated circuit.

In decision 550, manufacturing fixture 200 determines whether or not the 3D integrated circuit is acceptable for packaging. In other words, manufacturing fixture 200 determines whether or not the 3D integrated circuit is functional. If manufacturing fixture 200 determines that the 3D integrated circuit passes the test performed in step 545 and is acceptable for packaging (decision 550, YES branch), step 560 is performed. If manufacturing fixture 200 determines that the 3D integrated circuit is not acceptable for packaging (decision 550, NO branch), step 565 is performed.

In step 560, support structure 100 is removed from manufacturing fixture 200, the 3D integrated circuit is removed from support structure 100, and the 3D integrated circuit is packaged.

The method as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

What is claimed is:

1. A method comprising:
heating a three-dimensional integrated circuit to a base temperature, wherein the base temperature is below a melting temperature of a solder, and wherein the three-dimensional integrated circuit includes a plurality of solder bumps disposed between vertically stacked dies;
activating a first on-chip heat source to reflow a first portion of the plurality of solder bumps that is within a first local-hot-zone, wherein the first local-hot-zone has a temperature that is equal to or higher than the melting temperature of the solder; and
activating a second on-chip heat source to reflow a second portion of the plurality of solder bumps that is within a second local-hot-zone, wherein the second local-hot-zone has a temperature that is equal to or higher than the melting temperature of the solder.

2. The method of claim 1, further comprising responsive to monitoring temperatures within the first local-hot-zone and the second local-hot-zone, using one or more thermal diodes, adjusting one or both of a heat output of the first on-chip heat source and a heat output of the second on-chip heat source.

3. The method of claim 1, wherein the first on-chip heat source and the second on-chip heat source are each shunt resistors.

4. The method of claim 3, wherein a heat output of one or both of the first on-chip heat source and the second on-chip heat source are increased via pulse-width modulation.

5. The method of claim 1, wherein one or both of the first on-chip heat source and the second on-chip heat source include one or more processor cores.

6. The method of claim 5, wherein an electrical current is supplied to both of the first on-chip heat source and the second on-chip heat source, and wherein the first on-chip heat source and the second on-chip heat source are in a quiescent state.

7. The method of claim 5, wherein one or both of the first on-chip heat source and the second on-chip heat source are configured to execute a first scan operation.

8. The method of claim 7, wherein a heat output of the first on-chip heat source and a heat output of the second on-chip heat source are increased by execution of a second scan operation by the first on-chip heat source and the second on-chip heat source, wherein a greater count of transistors are simultaneously active in the second scan operation when compared with a count of transistors that are simultaneously active in the first scan operation.

9. The method of claim 5, wherein the first on-chip heat source and the second on-chip heat source are configured to execute a first computer program that provides inputs to a first plurality of logic gates and a second plurality of logic gates to generate heat, and wherein the first computer program provides inputs to the second plurality of logic gates based, at least in part, on logical outputs of the first plurality of logic gates.

10. The method of claim 9, wherein a heat output of the first on-chip heat source and a heat output of the second on-chip heat source are increased by execution of a second computer program, wherein the second computer program provides inputs to a third plurality of logic gates and a fourth plurality of logic gates to generate heat, and wherein the second computer program provides inputs to the fourth plurality of logic gates based, at least in part, on a logical output of the third plurality of logic gates, and wherein the second computer program involves a greater average count of instructions per second when compared to an average count of instructions per second of the first computer program.

11. The method of claim 1, further comprising:
providing heat via an external heat source to heat the three-dimensional integrated circuit to the base temperature.

12. The method of claim 11, wherein the external heat source is a thermoelectric device.

13. The method of claim 11, further comprising:
providing heat via a plurality of on-chip heat sources to heat the three-dimensional integrated circuit to the base temperature.

14. The method of claim 13, wherein at least one of the plurality of on-chip heat sources includes a shunt resistor.

15. The method of claim 13, wherein at least one of the plurality of on-chip heat sources includes a processor core.

16. The method of claim 15, wherein at least one of the plurality of on-chip heat sources are configured to execute scan operations.

17. The method of claim 15, wherein the plurality of on-chip heat sources are configured to execute computer programs.

18. The method of claim 13, further comprising:
responsive to determining, using a plurality of thermal diodes, a temperature of the three-dimensional integrated circuit at a plurality of points within the three-dimensional integrated circuit, adjusting a heat output of at least one on-chip heat source.

19. The method of claim 13, further comprising:
responsive to determining, using a plurality of thermal diodes, a temperature of the three-dimensional integrated circuit at a plurality of points within the three-dimensional integrated circuit, adjusting a heat output of the external heat source.

* * * * *